(12) United States Patent
Kanda (10) Patent No.: US 6,452,281 B1
(45) Date of Patent: Sep. 17, 2002

(54) SEMICONDUCTOR INTEGRATED CIRCUIT AND FABRICATION PROCESS THEREFOR

(75) Inventor: Makoto Kanda, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/058,061

(22) Filed: Jan. 29, 2002

(30) Foreign Application Priority Data

Jan. 29, 2001 (JP) ........................................ 2001-019950

(51) Int. Cl.⁷ .......................... H01L 23/48; H01L 23/52; H01L 29/40
(52) U.S. Cl. .......................... 257/780; 257/781; 438/613
(58) Field of Search ................................. 257/780, 781, 257/737, 738, 786; 438/613; 228/180.22

(56) References Cited

U.S. PATENT DOCUMENTS 6,020,626 A * 2/2000 Ohsawa et al.
6,406,751 B1 * 10/2001 Patel
6,372,620 B1 * 4/2002 Oosawa et al.
6,375,823 B1 * 4/2002 Matsuda et al.

FOREIGN PATENT DOCUMENTS

| JP | 1-110751 | 4/1989 |
| JP | 3-054829 | 3/1991 |

* cited by examiner

*Primary Examiner*—Sheila V. Clark
(74) *Attorney, Agent, or Firm*—Nixon & Vanderhye, P.C.

(57) ABSTRACT

A semiconductor integrated circuit is provided which includes bump electrodes having a uniform height. The semiconductor integrated circuit includes: a semiconductor substrate (wafer) having a plurality of bump electrode formation areas and a bump electrode non-formation area respectively defined on a front surface thereof; a first electrode pad formed in the bump electrode non-formation area; a second electrode pad formed in each bump electrode formation area; and a bump electrode formed on each second electrode pad; wherein the first electrode pad is used for supplying a plating electric current to the second electrode pads through the semiconductor substrate in formation of the bump electrodes by electrolytic plating.

9 Claims, 6 Drawing Sheets

Fig. 8

SEMICONDUCTOR INTEGRATED CIRCUIT AND FABRICATION PROCESS THEREFOR

CROSS-REFERENCE TO RELATED APPLICATION

This application is related to Japanese application No. 2001-019950 filed on Jan. 29, 2001, whose priority is claimed under 35 USC §119, the disclosure of which is incorporated by reference in its entirety.

BACKGROUND OF THE INVENTION

1. Field of the Invention

The present invention relates to a semiconductor integrated circuit and a fabrication process therefor. More particularly, the invention relates to a semiconductor integrated circuit which has a plurality of bump electrodes having a uniform height, and to a fabrication process therefor.

2. Description of the Related Art

In the fields of cellular phones and mobile information terminals in the electronic information industry, attempts have recently been made to increase the integration density of semiconductor devices. For a higher integration density, it is necessary to stably establish electrical and physical connections between minute electrode pads on a semiconductor device and interconnections on a substrate mounted with the semiconductor device.

One exemplary method for the establishment of the connections is to form gold bumps on electrode pads of the semiconductor device. Plating methods are generally employed for the formation of the gold bumps on the semiconductor device. The plating methods are broadly classified into two categories: an electroless plating method and an electrolytic plating method.

In the electroless plating method, a metal of a metal base to be plated is chemically replaced with a metal contained in a plating liquid. Therefore, the electroless plating method is advantageous in that equipment such as a plating power source is not required. However, possible combinations of the metal base and the plating liquid are limited, and a plating rate is relatively low. Therefore, the electroless plating method is not suitable for formation of a metal film having a thickness of ten-odd micrometers to several tens of micrometers as required for the formation of the bumps on the semiconductor device.

In the electrolytic plating method, on the other hand, the plating is electrochemically achieved by passing an electric current through a metal base to be plated and a plating liquid. Therefore, the electrolytic plating method can be applied to a combination of the metal base and the plating liquid to which the aforesaid electroless plating method cannot be applied. In the electrolytic plating method, the plating electric current increases the plating rate as compared with the electroless plating method, and a metal film having a thickness of several tens of micrometers can easily be formed. Therefore, the electrolytic plating method is suitable for the formation of the bumps on the semiconductor integrated circuit.

Next, a bump formation process employing the electrolytic plating method will briefly be described.

A metal base film is first formed on an insulating film provided on a semiconductor substrate (herein referred to as "wafer"). Then, a photoresist film is formed on the metal base film, and openings are formed in the photo resist film by a photo lithography technique to expose predetermined portions of the metal base film, i.e., in bump electrode formation areas. Thereafter, a plating electric current is supplied to the metal base film, whereby a metal is deposited on the exposed portions of the metal base film for formation of bump electrodes. There are three conventionally known methods for the supply of the plating electric current.

In a first conventional method, an opening for connection of a plating electrode (herein referred to as "cathode electrode") is formed in the photoresist film in a peripheral area of the wafer when the photoresist film is formed on the metal base film, and then the cathode electrode is connected to the metal base film through the opening. Alternatively, the photoresist film is removed by piercing the photo resist film with the cathode electrode for the connection of the cathode electrode to the metal base film.

Figure 5:
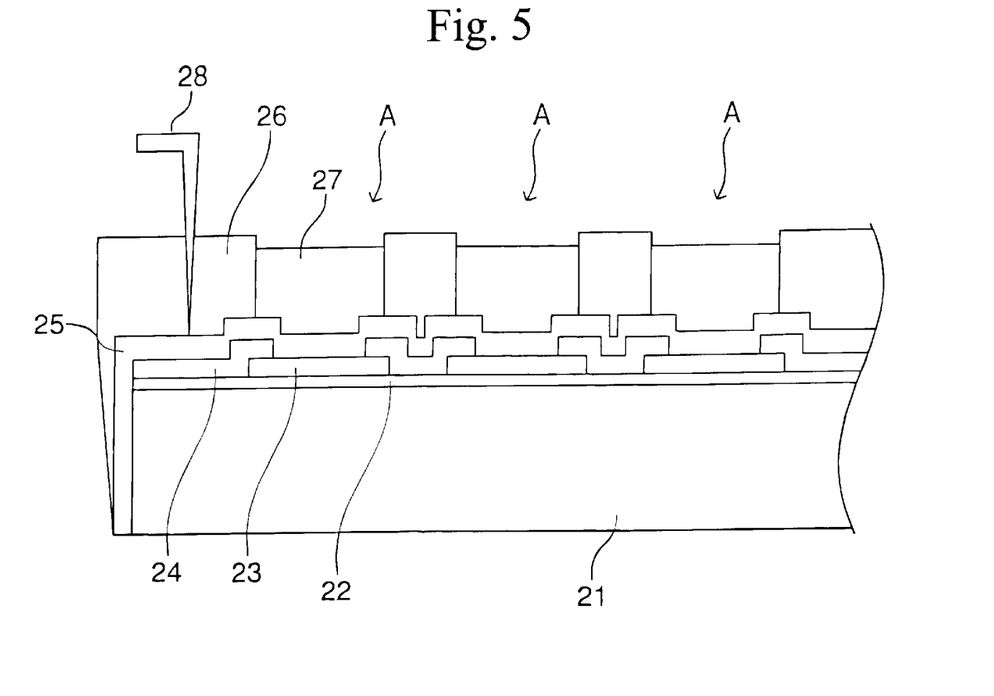
FIG. 5 is a diagram for explaining a conventional bump electrode formation process.

More specifically, electrode pads 23 are provided on an insulating film 22 on a wafer 21, and the wafer is covered with a protective film 24 which has openings on the electrode pads 23 in bump electrode formation areas A as shown in FIG. 5. A metal base film 25 is formed over the resulting wafer, and a photoresist film 26 is formed on the metal base film 25. Further, openings are formed in the photoresist film 26 in the bump electrode formation areas A.

The photoresist film 26 is pierced with a cathode electrode 28 for electrical connection of the cathode electrode 28 to the metal base film 25 (though not shown, an opening may be formed in the photoresist film 26 for connection of the cathode electrode to the metal base film).

Figure 6:
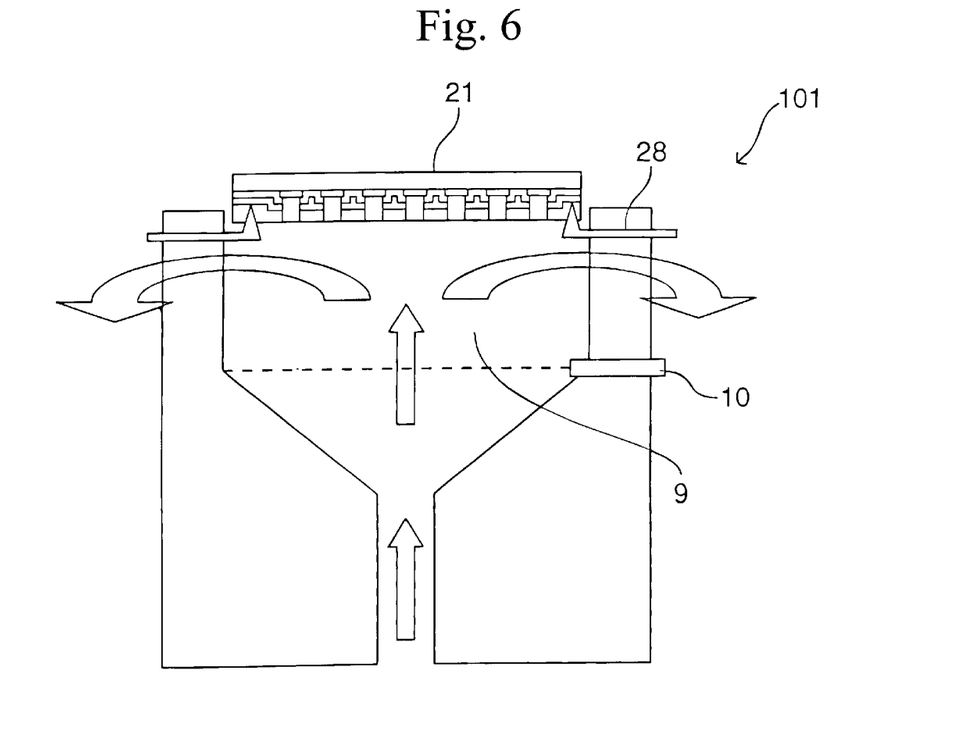
FIG. 6 is a diagram for explaining the conventional bump electrode formation process with a wafer being set in a plating device.

In turn, the resulting wafer 21 is set in a plating device 101 as shown in FIG. 6. The wafer 21 is supported by the cathode electrode 28 with a bump electrode formation surface thereof facing downward to be opposed to an anode electrode 10.

In the plating device 101, a plating liquid 9 is fountained from an inner lower side of the device toward the bump formation surface of the wafer 21, and discharged from the periphery of the wafer 21 to the outside.

In this state, a voltage is applied between the anode electrode 10 and the cathode electrode 28 connected to the metal base film 25 on the wafer 21, whereby a plating electric current is supplied to the metal base film 25 for formation of bump electrodes 27 (see FIG. 5).

In a second conventional method, a cathode electrode is connected to a portion of the metal base film on a side surface of the wafer (see, for example, Japanese Unexamined Patent Publication No. 1-110751 (1989)) in view of the fact that the metal base film is formed not only on the bump electrode formation surface but also on the side surfaces of the wafer.

Figure 7:
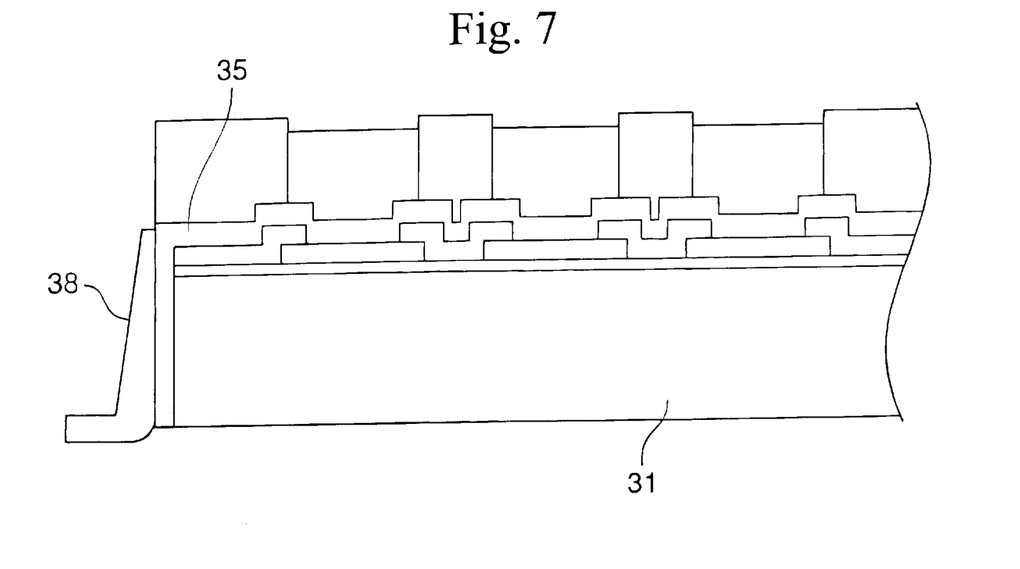
FIG. 7 is a diagram for explaining a conventional bump electrode formation process.

More specifically, a metal base film 35 is formed on a bump electrode formation surface and side surfaces of a wafer 31, and a cathode electrode 38 is electrically connected to a portion of the metal base film on the side surface of the wafer as shown in FIG. 7. Thereafter, the resulting wafer is subjected to the plating process in substantially the same manner as in the first method in the aforesaid plating device 101 (See FIG. 6).

In a third conventional method, a metal film electrically connected to the metal base film is formed on a back surface of the wafer, and a cathode electrode is connected to the metal film on the back surface of the wafer (see, for example, Japanese Unexamined Patent Publication No. 3-54829 (1991)).

Figure 8:
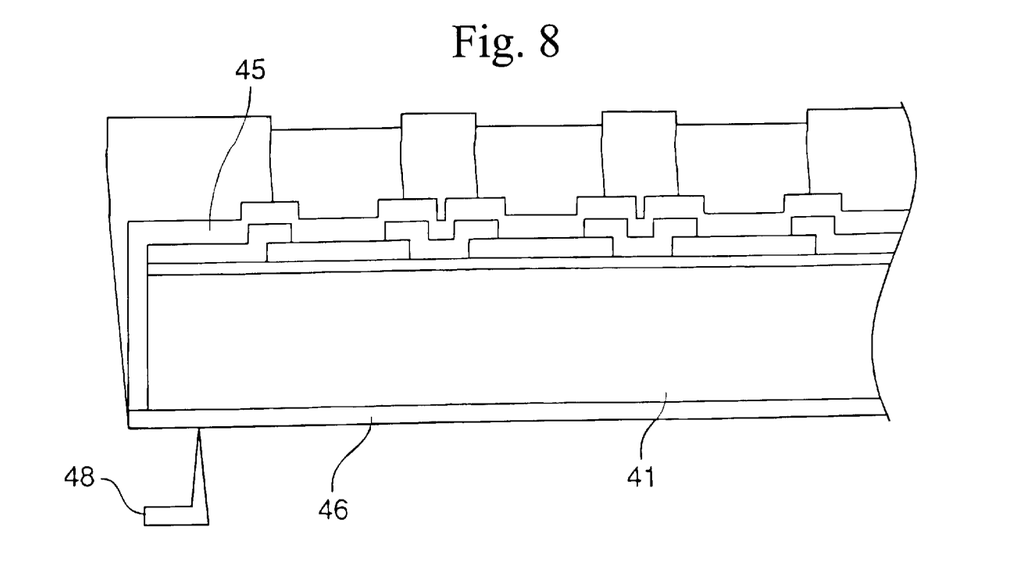
FIG. 8 is a diagram for explaining a conventional bump electrode formation process.

More specifically, a metal base film 45 is formed as covering a bump electrode formation surface and side surfaces of a wafer 41, and a metal film 46 is formed on a back surface of the wafer 41 so as to be electrically connected to the metal base film on the side surface of the wafer. A cathode electrode 48 is electrically connected to the metal film 46. Thereafter, the resulting wafer is subjected to the plating process in substantially the same manner as in the first method in the aforesaid plating device 101 (see FIG. 6).

In the first conventional method, the plating liquid penetrates through the opening provided for the cathode electrode connection during the plating process in the electrolytic plating device, so that the plating electric current is unevenly supplied to an area other than the bump electrode formation areas. Therefore, a metallization layer is uselessly formed in the unintended area by the plating, and the resulting bump electrodes are nonuniform in height.

Where the photoresist film is pierced with the cathode electrode to be removed, it is difficult to control the removal of the photoresist film. If the removal of the photoresist film is excessive, the aforesaid problem occurs. If the removal of the photoresist film is insufficient, an electrical connection cannot sufficiently be established between the cathode electrode and the metal base film, resulting in uneven supply of the plating electric current. Therefore, the resulting bump electrodes are nonuniform in height.

In the second conventional method, the metal base film is exposed on the side surfaces of the wafer, so that the plating liquid is easily brought into contact with the side surfaces of the wafer. Therefore, a metallization layer is uselessly formed on the side surfaces of the wafer, and the resulting bump electrodes are nonuniform in height.

In the third conventional method, the cathode electrode is connected to the metal film formed on the back surface of the wafer, so that the plating electric current is supplied to the bump electrode formation areas via the periphery of the wafer. Since distances between the periphery of the wafer and each bump formation area in the semiconductor integrated circuit formed on the wafer are different, plating potentials occurring in the bump formation areas are different.

Further, the metal base film has variations in thickness due to steps on the surface of the semiconductor integrated circuit on the wafer, so that the metal base film has variations in resistance depending on the position on the wafer. Due to these problems, the amperage of the plating electric current supplied to the metal base film varies depending on the position on the wafer, so that the resulting bump electrodes are nonuniform in height.

In the first to third conventional methods, a common approach is to supply the plating electric current via the periphery of the wafer, so that the amperage of the supplied plating electric current varies depending on the position on the wafer. Therefore, the first to third methods fail to form bump electrodes having a uniform height on the wafer.

Where bump electrodes having a height of about 20μm are to be formed on 6-inch wafer, for example, a maximum height variation of the bump electrodes is about 6μm in the first conventional method, about 5μm in the second method, and about 4μm in the third method.

In view of the foregoing, the present invention is directed to a semiconductor integrated circuit having bump electrodes of a uniform height and a fabrication process in which a plating electric current is evenly supplied over a wafer in an electrolytic plating process for formation of the bump electrodes.

SUMMARY OF THE INVENTION

In accordance with the present invention, there is provided a semiconductor integrated circuit which comprises a semiconductor substrate (wafer) having a plurality of bump electrode formation areas and a bump electrode non-formation area respectively defined on a front surface thereof; a first electrode pad formed in the bump electrode non-formation area; a second electrode pad formed in each bump electrode formation area; and a bump electrode formed on each second electrode pad; wherein the first electrode pad is used for supplying a plating electric current to the second electrode pads through the semiconductor substrate in formation of the bump electrodes by electrolytic plating.

DETAILED DESCRIPTION OF THE INVENTION

In accordance with one aspect of the present invention, there is provided a semiconductor integrated circuit which comprises a semiconductor substrate (wafer) having a plurality of bump electrode formation areas and a bump electrode non-formation area respectively defined on a front surface thereof; a first electrode pad formed in the bump electrode non-formation area; a second electrode pad formed in each bump electrode formation area; and a bump electrode formed on each second electrode pad; wherein the first electrode pad is used for supplying a plating electric current to the second electrode pads through the semiconductor substrate in formation of the bump electrodes by electrolytic plating.

In the inventive semiconductor integrated circuit, the semiconductor substrate forms an integrated circuit inside thereof.

The bump electrode formed on each second electrode pad is electrically connected to the integrated circuit through a wiring pattern.

The bump electrodes are frequently provided at a peripheral of the semiconductor substrate, since the bump electrodes serve for electrically connecting the semiconductor integrated circuit to an external wiring pattern of a mounting substrate, an external terminal of a lead frame or the like.

According to the invention, the plating electric current may be supplied from a back surface of the semiconductor substrate to the second electrode pads through the semiconductor substrate and the first electrode pad for supplying the plating electric current.

On this occasion, the general amount of the plating electric current is supplied from the back surface of the semiconductor substrate to each second electrode pad through the semiconductor substrate and the first electrode pad.

On the other hand, an electric resistance of a route running from the back surface of the semiconductor substrate to each second electrode pad through the semiconductor substrate, the integrated circuit and the wiring pattern is so high that the amount of the plating electric current supplied through the said route is slight.

Therefore, it is required that the first electrode pad has an enough size to reduce an electric resistance for the plating electric current.

Consequently, it is preferred that the bump electrode non-formation area is defined on a region having a sufficient size, for example, a peripheral of the e semiconductor substrate.

In the inventive semiconductor integrated circuit, the first electrode pad may be formed in the neighborhood of the second electrode pads.

In the inventive semiconductor integrated circuit, the bump electrode non-formation area may include a plurality of bump electrode non-formation areas respectively formed with first electrode pads. In this case, the first electrode pads are preferably equal to the second electrode pads in number so that each first electrode pad is adjacent to each second electrode pad.

With this arrangement, when the plating electric current is supplied from a cathode electrode to each second electrode pad via each first electrode pad provided adjacent to each bump electrode formation area, the plating electric current is evenly supplied to each second electrode pad, so that the resulting bump electrodes are uniform in height.

In the inventive semiconductor integrated circuit, semiconductor substrate may include a metal film on the back surface of the semiconductor substrate.

With this arrangement, an electric resistance to the plating electric current supplied from the cathode electrode can be reduced.

In accordance with another aspect of the present invention, there is provided a process for fabricating the semiconductor integrated circuit of the present invention, the process comprising the steps of: defining a plurality of bump electrode formation areas and a bump electrode non-formation area on a front surface of a semiconductor substrate (wafer), the bump electrode formation areas being insulated from the semiconductor substrate, the bump electrode non-formation area being conductive to the semiconductor substrate,; forming a first electrode pad in the bump electrode non-formation area; forming a second electrode pad in each bump electrode formation area; forming a conductive layer for connecting the first electrode pad and the second electrode pads on the semiconductor substrate; covering the front surface of the semiconductor substrate with a resist film except the second electrode pads; supplying a plating electric current from a back surface of the semiconductor substrate to the second electrode pads through the semiconductor substrate, the first electrode pad and the conductive layer; forming a bump electrode on each second electrode pad by electrolytic plating; and removing the resist film and the conductive layer from the semiconductor substrate.

In the inventive fabrication process, the step of defining the bump electrode non-formation area may include a step of defining a plurality of bump electrode non-formation areas on the front surface of the semiconductor substrate, and the step of forming the first electrode pad may include a step of forming a first electrode pad in each bump electrode non-formation area.

In the inventive fabrication process, the step of forming the first electrode pad may include a step of forming the first electrode pad in the neighborhood of the second electrode pads.

The inventive fabrication process may further comprise the step of forming a metal film on the back surface of the semiconductor substrate. In this case, the plating electric current may be supplied through the metal film.

Furthermore, in accordance with another aspect of the present invention, there is provided a semiconductor integrated circuit comprising a semiconductor substrate (wafer) having a bump electrode formation area and a bump electrode non-formation area respectively defined on a surface thereof; a first electrode pad formed in the bump electrode non-formation area; a second electrode pad formed in the bump electrode formation area; and a bump electrode formed on the second electrode pad; wherein the first electrode pad is used for supplying a plating electric current to the second electrode pad through the semiconductor substrate in formation of the bump electrode by electrolytic plating.

EMBODIMENTS

With reference to the attached drawings, the present invention will hereinafter be described in detail by way of embodiments thereof. It should be understood that the invention be not limited to the embodiments.

EMBODIMENTS 1

Figure 1:
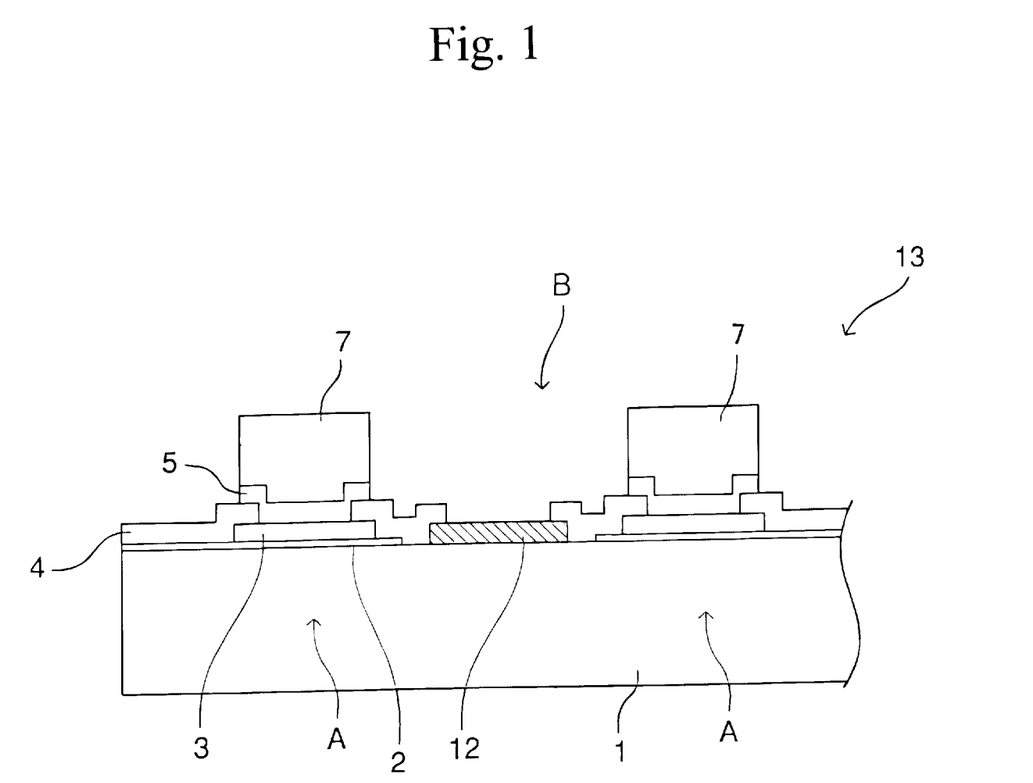
FIG. 1 is a sectional view illustrating a semiconductor integrated circuit according to Embodiment 1 of the present invention.

A semiconductor integrated circuit and a fabrication process therefor according to Embodiment 1 of the invention will be described with reference to FIGS. 1 to 4. FIG. 1 is a sectional view illustrating the semiconductor integrated circuit according to Embodiment 1 of the invention, and FIGS. 2(a) to 2(e) and FIGS. 3(f) and 3(g) are process diagrams for explaining a fabrication process for the semiconductor integrated circuit shown in FIG. 1. FIG. 4 is a graph illustrating a comparison between height variations of bump electrodes formed by a fabrication process according to Embodiment 1 and height variations of bump electrodes formed by a conventional fabrication process. In the following embodiments, like components are denoted by like reference characters.

As shown in FIG. 1, the semiconductor integrated circuit 13 according to Embodiment 1 of the invention includes a wafer (semiconductor substrate) 1 having a plurality of bump electrode formation areas A and a bump electrode non-formation area B respectively defined on a front surface thereof, a first electrode pad 12 formed in the bump electrode non-formation area B, a second electrode pad 3 formed in each bump electrode formation area A, and a bump electrode 7 formed on each second electrode pad 3. The first electrode pad 12 is used for supplying a plating electric current to the second electrode pads 3 through the wafer 1 from a back surface of the wafer 1 in formation of the bump electrodes 7 by electrolytic plating.

More specifically, an insulating film 2 is provided on the wafer 1, and second electrode pads 3 are provided on the insulating film 2. The second electrode pads 3 are partly protected by a protective film 4, and a metal base film 5 is provided between the bump electrodes 7 and the second electrode pads 3.

The wafer 1 forms an integrated circuit (not shown) inside thereof. A wiring pattern (not shown) extends from the second electrode pads 3 to the integrated circuit and is electrically connected to the integrated circuit via a contact hole (not shown) opened at insulating film 2.

Eventually, each bump electrode 7 is electrically connected to the integrated circuit through the wiring pattern.

Referring to FIGS. 2(a) to 2(g), an explanation will be given to a process for forming the bump electrodes 7 of the semiconductor integrated circuit 13 of Embodiment 1 shown in FIG. 1. Where the bump electrode formation process employs the same process conditions as in an ordinary semiconductor integrated circuit fabrication process, a detailed explanation. will not be given thereto.

Figure 2A:
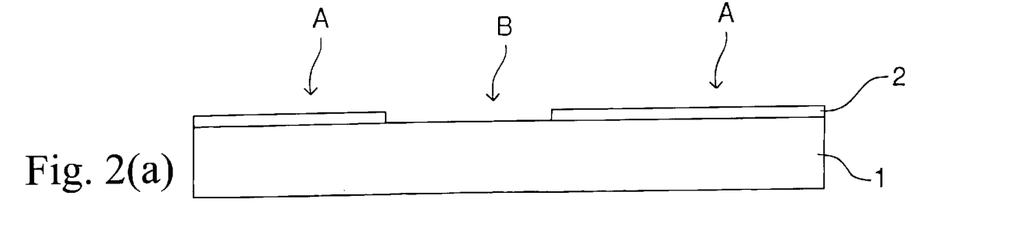
FIGS. 2(a) to 2(e) and FIGS. 2(f) and 2(g) are process diagrams for explaining a bump electrode formation process for the semiconductor integrated circuit shown in FIG. 1.

As shown in FIG. 2(a), an insulating film 2 having a thickness of about 1$\mu$m is formed on the entire front surface of a wafer 1 incorporating a integrated circuit by a CVD method, and then an opening is formed in the insulating film 2 in the vicinity of bump electrode formation areas A by a photolithography technique for formation of a bump electrode non-formation area B.

The bump electrode non-formation area B has substantially the same size and shape as bump electrodes 7 (see FIG. 1) to be formed in this embodiment, for example, a 40$\mu$m× 40$\mu$m square shape, to allow for passage of a sufficient plating electric current.

Figure 2B:
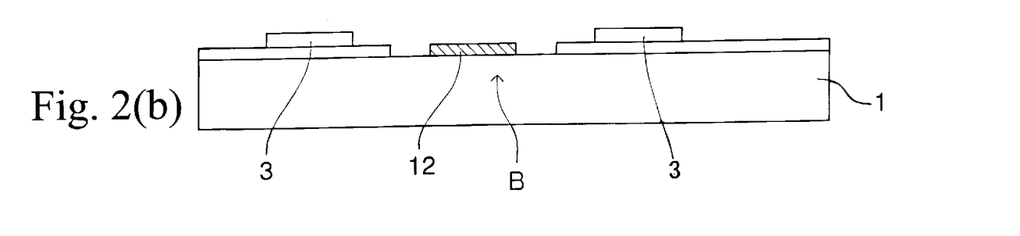

Then, a metal film is formed over the entire front surface of the wafer 1 by a sputtering method, and patterned by a photolithography technique and an etching technique for formation of second electrode pads 3 and a first electrode pad 12 for supplying the plating electric current as shown in FIG. 2(b). The first electrode pad 12 is formed directly on the wafer 1 for electrical connection to the wafer 1.

Figure 2C:
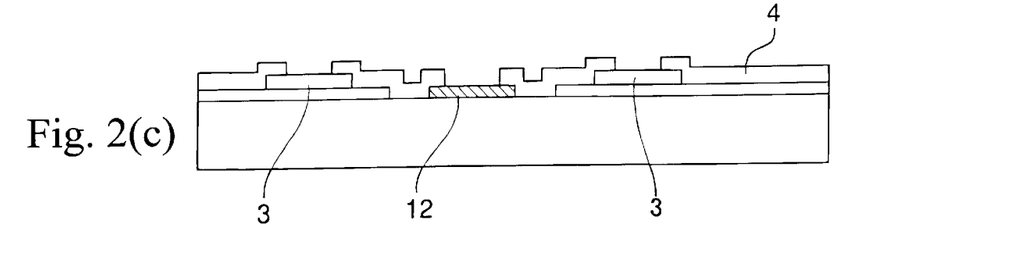

As shown in FIG. 2(c), a protective film 4 having a thickness of about 1$\mu$m is formed over the resulting wafer, and openings are formed in the protective film 4 to expose parts of the second electrode pads 3 and the first electrode pad 12.

Figure 2D:
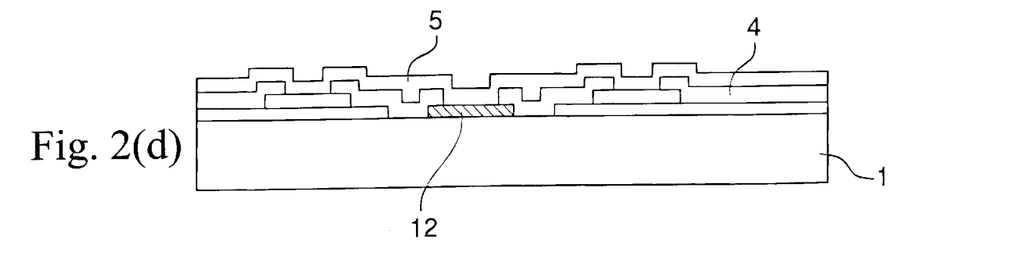

In turn, a metal base film 5 composed of a single metal or plural types of metals is formed over the resulting wafer by a sputtering method as shown in FIG. 2(d).

Figure 2E:
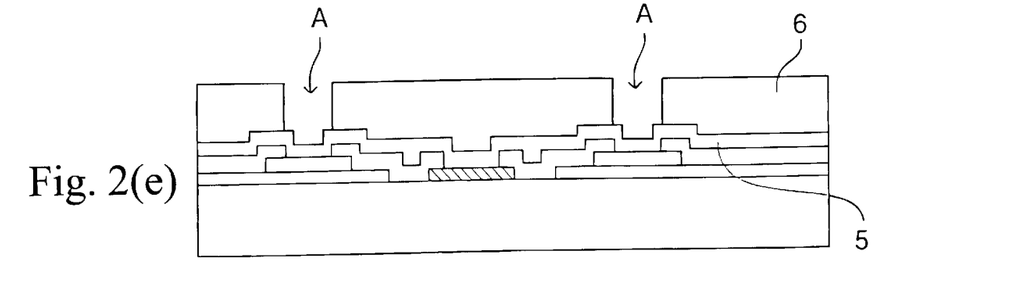

As shown in FIG. 2(e), a photoresist film 6 is formed over the metal base film 5, and openings are formed in the photoresist film 6 in the bump electrode formation areas A.

Figure 2F:
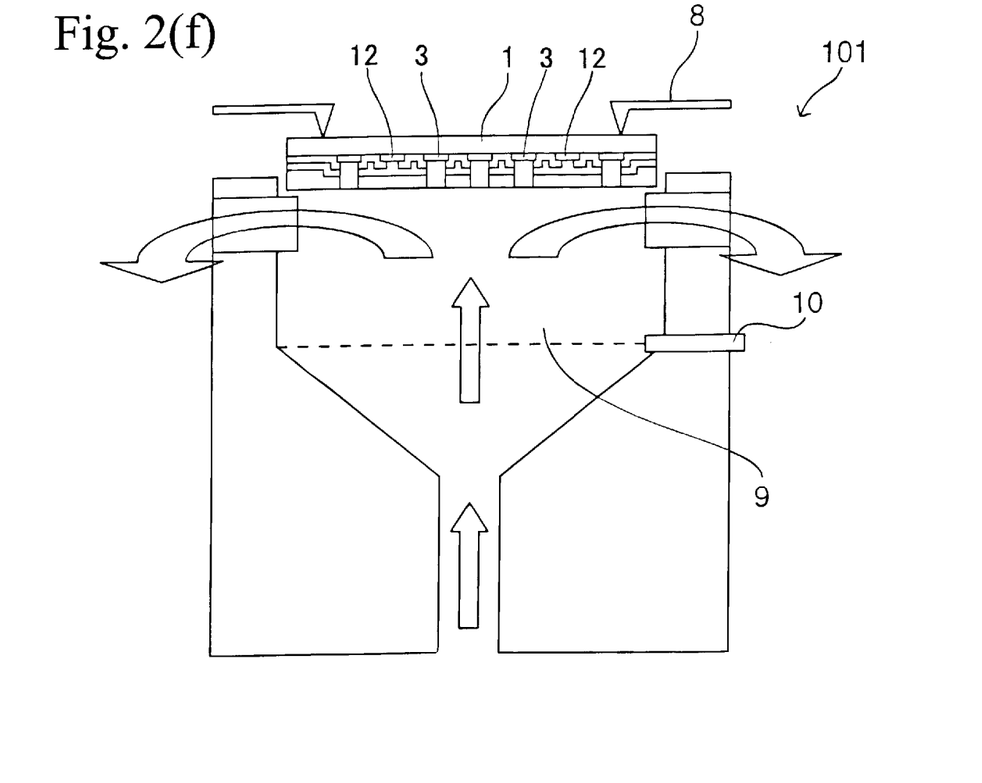

Thereafter, the resulting wafer 1 is set in a plating device 101 as shown in FIG. 2(f). The wafer 1 is set with a bump electrode formation surface thereof facing downward to be opposed to an anode electrode 10, and cathode electrodes 8 are connected to the back surface of the wafer 1 opposite from the bump electrode formation surface.

In the plating device 101, a plating liquid 9 is fountained from an inner lower side of the device toward the bump formation surface, and then discharged from the periphery of the wafer 1 outside the plating device 101.

Figure 2G:
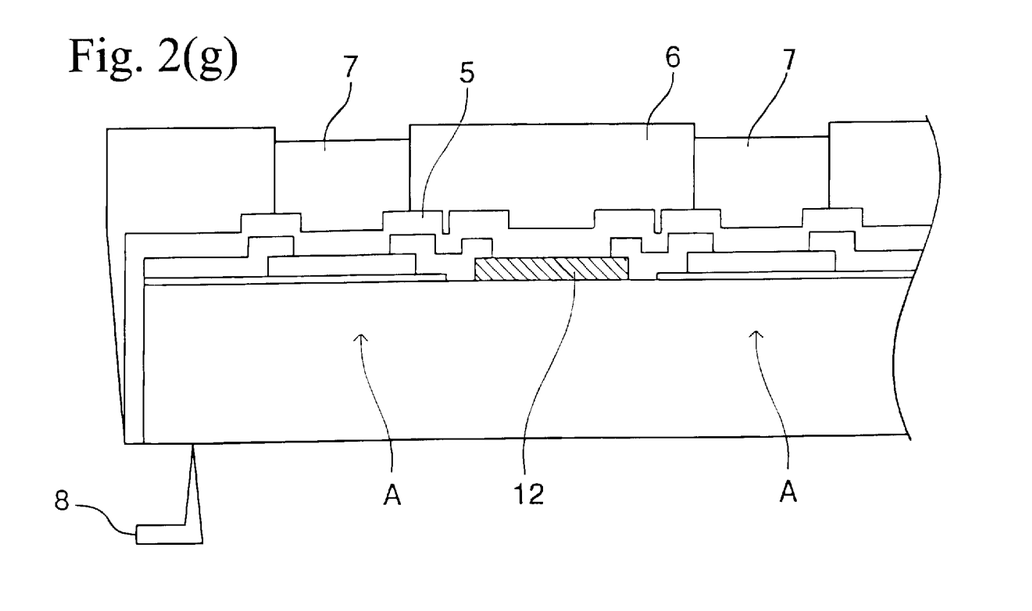

In this state, a voltage is applied between the anode electrode 10 and the cathode electrodes 8, whereby the plating electric current is supplied to the metal base film 5 through the first electrode pad 12 adjacent to the bump electrode formation areas A as shown in FIG. 2(g). Thus, the bump electrodes 7 are formed.

Then, the photoresist film 6 is removed, and a portion of the metal base film 5 is removed by using the bump electrodes 7 as a mask. Thus, the semiconductor integrated circuit 13 shown in FIG. 1 is fabricated.

Figure 3:
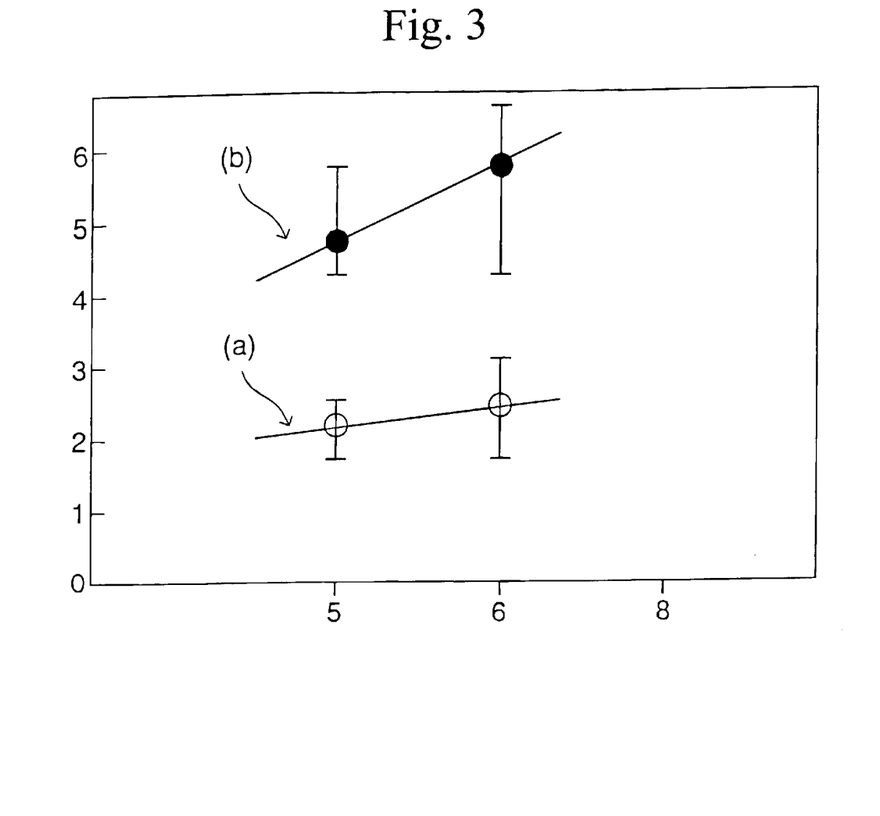
FIG. 3 is a graph illustrating a comparison between height variations of bump electrodes formed by a fabrication process according to Embodiment 1 and height variations of bump electrodes formed by a conventional fabrication process.
Figure 4:
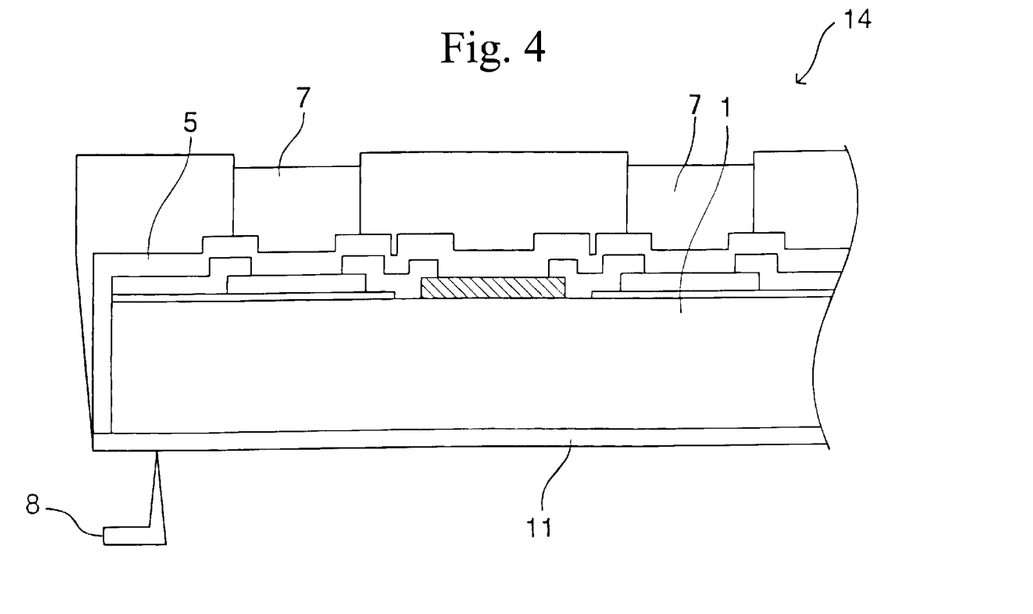
FIG. 4 is a sectional view of a semi-finished semiconductor integrated circuit in a bump electrode formation process according to Embodiment 2 of the invention.

Referring to FIG. 3, an explanation will be given to height variations of the bump electrodes 7 formed by the fabrication process according to Embodiment 1 and height variations of the bump electrodes formed by the first to third conventional methods (see FIGS. 6 to 8).

Where a plurality of 20-$\mu$m high bump electrodes were formed on a 5-inch wafer and a 6-inch wafer each incorporating an integrated circuit by the fabrication process according to Embodiment 1, a maximum height variation of the bump electrodes over the wafer was suppressed to 2 to 3$\mu$m as indicated by a line (a) in FIG. 3.

Where a plurality of 20-$\mu$m high bump electrodes were formed on a 5-inch wafer and a 6-inch wafer each incorporating an integrated circuit by the first to third conventional methods, on the other hand, a maximum height variation of the bump electrodes over the wafer was 4 to 6$\mu$m as indicated by a line (b) in FIG. 3.

In general, the height variations of the bump electrodes are required to be suppressed to not greater than 4$\mu$m in a semiconductor integrated circuit mounting process. The height variations of the bump electrodes formed by the fabrication process according to Embodiment 1 satisfy this requirement.

EMBODIMENT 2

With reference to FIG. 4, an explanation will be given to a semiconductor integrated circuit according to Embodiment 2 of the present invention. FIG. 4 is a sectional view of a semi-finished semiconductor integrated circuit (corresponding to FIG. 2(g) in Embodiment 1) in a bump electrode formation process according to Embodiment 2 of the invention.

As shown in FIG. 4, the semiconductor integrated circuit 14 according to Embodiment 2 of the invention includes a metal film 11 provided on the entire back surface of a wafer 1. The metal film 11 serves for connection to a cathode electrode 8, and is electrically connected to a metal base film 5. The other construction of the semiconductor integrated circuit 14 is the same as that of Embodiment 1 described above.

With the metal film 11 provided over the entire back surface of the wafer 1, a resistance to the plating electric current supplied from the cathode electrode 8 for formation of bump electrodes 7 can be reduced.

In accordance with the present invention, the first electrode pad is provided in the bump electrode non-formation area for supplying the plating electric current to the second electrode pads through the semiconductor substrate in the formation of the bump electrodes by the electrolytic plating. Therefore, the plating electric current can evenly be supplied over the semiconductor substrate (wafer), so that the bump electrodes of the semiconductor integrated circuit are uniform in height.

What is claimed is:

1. A semiconductor integrated circuit comprising:
   a semiconductor substrate having a plurality of bump electrode formation areas and a bump electrode non-formation area respectively defined on a front surface thereof;
   a first electrode pad formed in the bump electrode non-formation area;
   a second electrode pad formed in each bump electrode formation area; and a bump electrode formed on each second electrode pad;

wherein the first electrode pad is used for supplying a plating electric current to the second electrode pads through the semiconductor substrate in formation of the bump electrodes by electrolytic plating.

2. A semiconductor integrated circuit as set forth in claim 1, wherein the bump electrode non-formation area includes a plurality of bump electrode non-formation areas respectively formed with first electrode pads.

3. A semiconductor integrated circuit as set forth in claim 1, the first electrode pad is formed in the neighborhood of the second electrode pads.

4. A semiconductor integrated circuit as set forth in claim 1, semiconductor substrate includes a metal film on a back surface of the semiconductor substrate.

5. A process for fabricating the semiconductor integrated circuit of claim 1, the process comprising the steps of:

defining a plurality of bump electrode formation areas and a bump electrode non-formation area on a front surface of a semiconductor substrate, the bump electrode formation area being insulated from the semiconductor substrate, the bump electrode non-formation area being conductive to the semiconductor substrate,;

forming a first electrode pad in the bump electrode non-formation area;

forming a second electrode pad in each bump electrode formation area;

forming a conductive layer for connecting the first electrode pad and the second electrode pads on the semiconductor substrate;

covering the front surface of the semiconductor substrate with a resist film except the second electrode pads;

supplying a plating electric current from a back surface of the semiconductor substrate to the second electrode pads through the semiconductor substrate, the first electrode pad and the conductive layer;

forming a bump electrode on each second electrode pad by electrolytic plating; and removing the resist film and the conductive layer from the semiconductor substrate.

6. A process as set forth in claim 5, wherein the step of defining the bump electrode non-formation area includes a step of defining a plurality of bump electrode non-formation areas on the front surface of the semiconductor substrate, and the step of forming the first electrode pad includes a step of forming a first electrode pad in each bump electrode non-formation area.

7. A process as set forth in claim 5, wherein the step of forming the first electrode pad includes a step of forming the first electrode pad in the neighborhood of the second electrode pads.

8. A process as set forth in claim 5, further comprising the step of forming a metal film on the back surface of the semiconductor substrate, wherein the plating electric current is supplied through the metal film.

9. A semiconductor integrated circuit comprising:

a semiconductor substrate having a bump electrode formation area and a bump electrode non-formation area respectively defined on a surface thereof;

a first electrode pad formed in the bump electrode non-formation area;

a second electrode pad formed in the bump electrode formation area; and a bump electrode formed on the second electrode pad;

wherein the first electrode pad is used for supplying a plating electric current to the second electrode pad through the semiconductor substrate in formation of the bump electrode by electrolytic plating.

* * * * *